(12) United States Patent
Cho et al.

(10) Patent No.: US 9,618,547 B2
(45) Date of Patent: Apr. 11, 2017

(54) DIGITAL CIRCUIT POWER MEASUREMENTS USING NUMERICAL ANALYSIS

(71) Applicant: UNIVERSITY OF SOUTHERN CALIFORNIA, Los Angeles, CA (US)

(72) Inventors: Young H. Cho, Chatsworth, CA (US); Siddharth S. Bhargav, Los Angeles, CA (US); Andrew Goodney, Los Angeles, CA (US)

(73) Assignee: UNIVERSITY OF SOUTHERN CALIFORNIA, Los Angeles, CA (US)

( * ) Notice: Subject to any disclaimer, the term of this patent is extended or adjusted under 35 U.S.C. 154(b) by 556 days.

(21) Appl. No.: 13/719,916

(22) Filed: Dec. 19, 2012

(65) Prior Publication Data
US 2013/0191054 A1 Jul. 25, 2013

Related U.S. Application Data

(60) Provisional application No. 61/589,988, filed on Jan. 24, 2012.

(51) Int. Cl.
*G01R 22/00* (2006.01)
*G06F 17/40* (2006.01)
*G01R 22/10* (2006.01)

(52) U.S. Cl.
CPC ............. *G01R 22/00* (2013.01); *G01R 22/10* (2013.01); *G06F 17/40* (2013.01)

(58) Field of Classification Search
CPC ..... G01R 22/00; G01R 22/10; G06F 11/3062; G06F 17/40; G06F 1/26; G06F 1/3203
(Continued)

(56) References Cited

U.S. PATENT DOCUMENTS 6,021,381 A * 2/2000 Ohnishi ........................ 702/60
7,460,965 B2 * 12/2008 Saeki et al. .................... 702/57
(Continued)

FOREIGN PATENT DOCUMENTS

JP       10-154172 A       6/1998
KR    10-2011-009128 A    8/2011

OTHER PUBLICATIONS

Anderson, J.H. et al. 2004. Power Estimation Techniques for FPGAs. IEEE Transaction on VLSI, v12, pp. 1015-1027.
(Continued)

*Primary Examiner* — John H Le
(74) *Attorney, Agent, or Firm* — McDermott Will & Emery LLP (57) ABSTRACT

Power consumed by a digital circuit that contains multiple sub-circuits may be computed. Each sub-circuit may include more than one transistor and have at least one input. A signal transition sensor may be connected to an input to each sub-circuit and configured to count the number of signal transitions at the input or to time the duration of a signal transition at the input. Weight information may be stored that is indicative of an amount of power that is being consumed by each sub-circuit based on a count that is counted by or a time duration that is timed by each signal transition sensor that is connected to an input of that sub-circuit. The amount of power being consumed by the digital circuit may be computed based on a count that is counted by or a time duration that is timed by each signal transition sensor and the weight information.

25 Claims, 4 Drawing Sheets

(58) Field of Classification Search
USPC .... 702/45, 60, 61, 69, 57; 713/340; 716/108
See application file for complete search history.

(56) References Cited

U.S. PATENT DOCUMENTS

| | | | |
|---|---|---|---|
| 7,756,654 | B2 | 7/2010 | Yamamoto et al. |
| 2008/0092092 | A1 | 4/2008 | Dalton et al. |
| 2009/0259869 | A1 | 10/2009 | Naffziger |
| 2011/0288793 | A1 | 11/2011 | Sanchez-Loureda et al. |
| 2012/0095737 | A1* | 4/2012 | Sasaki .................. G06F 17/504 703/2 |

OTHER PUBLICATIONS

Bernstein, K. et al. 2006. High-Performance CMOS Variability in the 65-nm Regime and Beyond. IBM J. Res. & Dev. 50, No. 4/5, pp. 433-449.

Bryant, R.E. 1986. Graph-Based Algorithms for Boolean Function Manipulation. IEEE Transactions on Computers, C-35(8): pp. 677-691.

Buyukasahin, K. M. et al. 2005. Early Power Estimation for VLSI Circuits. IEEE Trans. on Computer-aided design of integrated circuits and systems, vol. 24, pp. 1076-1088.

Gupta, S. et al. 2000. Power modeling for high-level power estimation, IEEE Trans. VLSI systems, vol. 8, No. 1, , Feb. 2000, pp. 18-29.

Najm, F. 1993. Transition density: a new measure of activity in digital circuits. IEEE Trans. on Computer-Aided Design of Integrated Circuits and Systems, vol. 12, Feb. 1993, pp. 310-323.

Pedram, M. et al. 2002. Power Aware Design Methodologies. Kluwer Academic Publishers, front matter and pp. 245-249, 256, 259-260, 279-281, 421-443.

Rabaey, J. et al. 2003. Digital Integrated circuits: a design perspective. Pearson Education (2003), Item No. 0130909963, front matter and pp. 30-31, 99.

International Search Report and Written Opinion of the International Searching Authority (KIPO), dated Apr. 25, 2013, for PCT Application PCT/US2012/070713, filed Dec. 19, 2012, entitled "Digital Circuit Power Measurements Using Numerical Analysis."

* cited by examiner

FIG. 6 under Grant No. 09005596, awarded by the National Science Foundation (NSF) NetSE: Green Edge Networks (GEN). The Government has certain rights in the invention.

DIGITAL CIRCUIT POWER MEASUREMENTS USING NUMERICAL ANALYSIS

CROSS-REFERENCE TO RELATED APPLICATION[S]

This application is based upon and claims priority to U.S. provisional patent application 61/589,988, entitled "METHOD OF MEASURING ACCURATE DYNAMIC POWER CONSUMPTION OF INTEGRATED COMPONENTS AND SUB-CIRCUITS," filed Jan. 24, 2012. The entire content of this application is incorporated herein by reference.

STATEMENT REGARDING FEDERALLY SPONSORED RESEARCH

This invention was made with Government support under Grant No. 09005596, awarded by the National Science Foundation (NSF) NetSE: Green Edge Networks (GEN). The Government has certain rights in the invention.

BACKGROUND

Technical Field

This disclosure relates to determining the power being used by digital circuits and to power management and other applications for this information.

Description of Related Art

--Introduction

Dynamic power management algorithms can improve the way computing systems utilize available power. Algorithms can rely on power measurements or estimates to make intelligent power management decisions. For emerging computer technologies, accuracy and resolution of power measurement may play a greater role in low power system designs and dynamic power management plans.

Power consumed by an electric circuit can be directly measured with current sense resistors, amplifiers, and analog-to-digital converters (ADCs). This may be the most intuitive way of measuring power accurately in digital circuits. However, it may introduce practical challenges for emerging platforms such as mobile phones and systems-on-chips (SOCs). These challenges may include scalability, instrumentation error, and ADC related resource overhead.

System developers have been interested in measuring power at a board level for low-power operation and at chip level to increase manufacturing yield. Broadly speaking, three techniques have been considered: (1) direct measurement with ADC; (2) power model based estimation; and (3) a hybrid method using sensors and power models.

--Dedicated Analog to Digital Converters

Recent works, like Low Power Energy Aware Processing (LEAP) platform and MIT's recent on-chip ADC based power minimization technique have been demonstrated to save up to 60% and 2× power in embedded systems, respectively. However, such techniques may suffer instrumentation errors, aging, scalability, and delays associated with ADCs. Also, as the intrinsic gain of transistors decreases with manufacturing technology scaling, it may become harder to implement such technologies using on-chip ADCs.

--Power Model Based Estimation

This type of power estimation may rely on an accurate, on-line extraction of a power model for each architecture component from workload information and external ADC based power measurement. This method may eliminate the need for ADCs on-chip. However, the system may rely on values from external ADCs over long windows of time to build workload specific power models. With significant differences found in resulting power models across different workloads, errors can be evident, even at low sampling rates and fewer channels, as shown below in Table 1.

--Estimation Using Built-In Event Counters

More recent on-chip power measurement techniques add another dimension to the model based technique by leveraging information collected by built-in event counters on processors. Using counter values, workloads, and ADC measurements, effective capacitances of various logic blocks can be more accurately modeled. Given a sufficient number of power models, counter values can be used to estimate the power dissipated by various components at a given time.

For ICs with built-in event counters—common in general purpose processors—the improvements in on-chip power estimation may come at a relatively low overhead, since there is no need to change existing hardware. However, this technique may suffer similar kinds of problems to those associated with inaccuracies in the power modeling technique described above, especially when presented with an increasing number of micro-architecture components. Furthermore, this technique may require highly complex algorithms to obtain power numbers. This may require longer times and greater computation resources to make intelligent power management decisions.

--Logical Partition Power Measurement

Another low power digital design has been parametric clustering of logic to optimize power. Power may be estimated through simulation to optimize logic clusters to achieve minimum power. Some efforts also measure the power of the logical partitions to evaluate the design for possible gains in power reduction through logic re-synthesis. To enable such a system to provide designers with practical feedback on their work, FPGA and ASIC manufacturers have provided an on-chip tool to measure power for a limited number of partitions which uses on-chip ADCs or design model simulation. However, these methods may have large errors due to routing patterns, ADC instrumentation, and/or model accuracy and limited channels that might mislead.

SUMMARY

A system may measure power consumed by a digital circuit that contains multiple sub-circuits. Each sub-circuit may include more than one transistor and having at least one input. The system may include a signal transition sensor connected to an input to each sub-circuit and configured to count the number of signal transitions at the input or to time the duration of a signal transition at the input. A data storage system may store weight information indicative of an amount of power that is being consumed by each sub-circuit based on a count that is counted by or a time duration that is timed by each signal transition sensor that is connected to an input of that sub-circuit. A power consumption computation system may compute the amount of power being consumed by the digital circuit based on a count that is counted by or a time duration that is timed by each signal transition sensor and the weight information.

The power consumption computation system may compute the amount of power being consumed by the digital circuit by summing the power that is consumed by each sub-circuit, as determined based on each count that is counted by or each time duration that is timed by each signal transition sensor that is connected to an input of that sub-circuit and the weight information for that sub-circuit.

Each of the sub-circuits may not contain any energy-consuming component that is in another of the sub-circuits.

Each of the sub-circuits may consist of more than a single transistor.

All of the sub-circuits may collectively include all of the energy-consuming components that are in the digital circuit.

At least one of the sub-circuits may include at least two inputs. There may be a different signal transition sensor connected to at least two of the inputs of the sub-circuit.

For each sub-circuit, the input to which a signal transition sensor is connected, or the inputs to which different signal transition sensors are connected collectively, may control all changes in the power consumption of all components within that sub-circuit.

The system may include a weight computation system configured to determine the weight information. The weight computation system may include a power measuring circuit configured to measure the total power being consumed by the digital circuit. The weight computation system may include a sampling circuit that is configured to sample and store operational information that is indicative of the following for each of a set of different power-consumption conditions under which the digital circuit is operated: (a) the power consumed by the digital circuit during the power-consumption condition, as measured by the power measuring circuit; and (b) the count of the number of signal transitions that is counted by or the time duration of a signal transition that is timed by each of the signal transition sensors during the operational condition. The weight computation system may include a simultaneous equation solver system configured to solve a set of simultaneous equations, one for each power-consumption condition, to determine the weight information. Each equation may relate the power consumed by the digital circuit during the power-consumption condition to which the equation is associated to the sum of the power consumed by each sub-circuit during the operational condition, as determined based on the count of the number of signal transitions that is counted by or the time duration of a signal transition that is timed by each of the signal transition sensors that are connected to an input of that sub-circuit during the operational condition, and the weigh information concerning that sub-circuit that is to be determined.

The weight computation system may be configured to compensate for power that is consumed due to circumstances other than signal transitions on the inputs to which a signal transition sensor is connected. The weight compensation system may be configured to compensate by performing a statistical fitting of the total power measured by the power measuring circuit to the sum of the power consumed by each sub-circuit, as determined based on the count of the number of signal transitions that is counted by or the time duration of a signal transition that is timed by each of the signal transition sensors that are connected to an input of that sub-circuit, and the weigh information concerning that sub-circuit that is to be determined.

The power consumption circuit may be configured to determine the power consumed by at least one sub-section of at least one sub-circuit that is not monitored by a signal transition sensor using a binary decision diagram.

The system and the digital circuit may both be on a single chip.

The digital circuit may be on a chip, and the system may be configured to dynamically manage the power that is consumed by the chip.

The system may be configured to predict future power needs of the digital circuit and, based thereon, to dynamically manage the power that is consumed by the chip.

The digital circuit may be on a mobile computing platform, and the system may be configured to dynamically manage the power that is consumed by the mobile computing platform.

The system may be configured to identify stressed sub-circuits within the digital circuit. The system may be configured to identify the location and timing of ground bounce.

The system may be configured to generate a power specification for the digital circuit.

A method may determine weight information for each sub-circuit that contains multiple transistors in a digital circuit that is indicative of an amount of power that is being consumed by the sub-circuit based on a count of a number of signal transitions or a time duration of a signal transition at at least one input to the sub-circuit that is monitored by a signal transition sensor. The method may include sampling and storing in a data storage system during each of a set of different power-consumption conditions under which the digital circuit is operated: the total power being consumed by the digital circuit, as measured by a power measuring circuit; the count of the signal transitions or the time duration of a signal transition at each monitored input to each sub-circuit, as determined by one of the signal transition sensors; and solving a set of simultaneous equations, one for each power-consumption condition, to determine the weight information. Each equation may relate the power consumed by the digital circuit during the power-consumption condition to which the equation is associated, to the sum of the power consumed by each sub-circuit during the operational condition, as determined based on the count of the number of signal transitions that is counted by or the time duration of a signal transition that is timed by each of the signal transition sensors that are connected to an input of that sub-circuit during the operational condition, and the weigh information concerning that sub-circuit that is to be determined.

These, as well as other components, steps, features, objects, benefits, and advantages, will now become clear from a review of the following detailed description of illustrative embodiments, the accompanying drawings, and the claims.

BRIEF DESCRIPTION OF DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

DETAILED DESCRIPTION OF ILLUSTRATIVE EMBODIMENTS

Illustrative embodiments are now described. Other embodiments may be used in addition or instead. Details that may be apparent or unnecessary may be omitted to save space or for a more effective presentation. Some embodiments may be practiced with additional components or steps and/or without all of the components or steps that are described.

An accurate power measurement method may be based on principles of transistor theory and a unique use of digital circuits and applied mathematics. This may provide a high resolution power measurement technique that may be more scalable, lower in power, and less invasive than methods using ADCs.

The approach may include a hardware/software solution for precision power measurement for digital circuits at different levels ranging from PC board components down to on-chip circuits. Sensors may be included that are constructed using digital logic gates that may have lower fabrication cost and power requirements than traditional analog counterparts. A run-time algorithm may be included that uses the digital outputs of the sensors to accurately quantify power with minimal delay. The underlying mathematical basis of this algorithm may filter out errors caused by ambient noise and instrumentation calibration.

Some of these concepts have been demonstrated on an FPGA platform. The design simultaneously monitored 350 different instrumentation points that were used to obtain dynamic power for 28 sub components instantiated inside an FPGA and the components on-board at 250 kS/sec. Measurements obtained from this system differed from those acquired using an accurate ADC by no more than 2%. An off-line data analysis indicates that this method may be more resilient to instrumentation errors than ADC.

Figure 1:
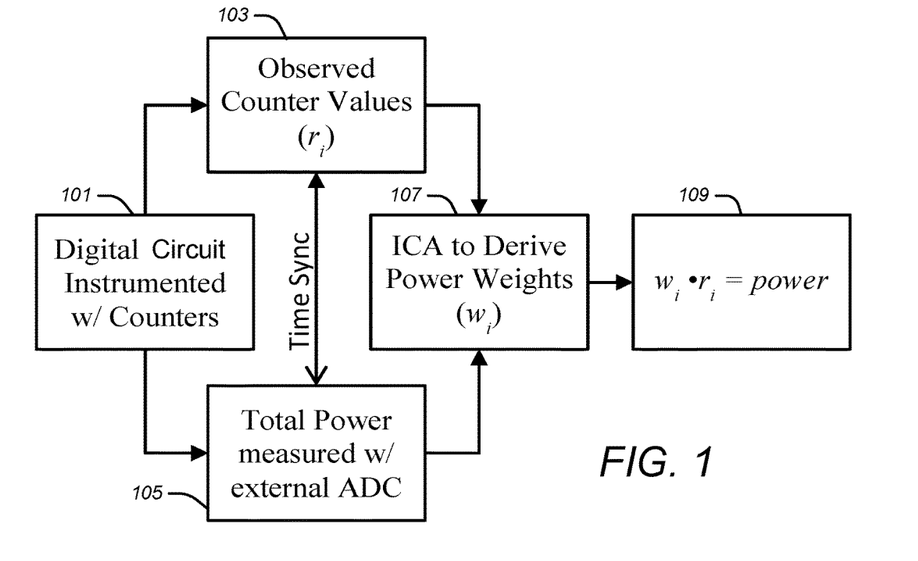
FIG. 1 is a flow chart of an example of this technology.

FIG. 1 is a flow chart of an example of this technology. A digital circuit may be instrumented with signal transition counters, as reflected in a Digital Circuit Instrument w/Counters step 101. Each counter may be located at an input to a sub-circuit of the digital circuit that includes multiple transistors that may all be affected by a signal transition at the input, but that does not include transistors that are affected by signal transitions at other counted inputs. A sufficient number of these inputs may be instrumented with counters so that changes in the state of all of the transistors in the digital circuit are tracked by the collective tracking of the counted signal inputs. This may obviate the need for placing counters at the signal transitions at the input of every transistor in the digital circuit.

The values of the counts of each counter may be sampled periodically, as reflected by a Observed Counter Values ($r_i$) step 103. The power of the entire digital circuit may also be sampled periodically by, for example, an ADC, as reflected by a Total Power measured w/external ADC step 105.

An independent component analysis (ICA) may be performed to determine the weight to be given to the value of the counts of each transition counter, based on the counts and the total power measured during several different samplings, as reflected by an ICA to Derive Power Weights ($w_i$) step 107. Once the weights are determined, power may then be determined based on the determined weights and the count values, as reflected by a $w_i * r_i$=power step 109. More details about each of these steps are provided below.

Table 1 below compares examples of various partition power estimation techniques with an example of the one proposed herein, referred to in the table and elsewhere herein as "Counters with Numerical Analysis."

TABLE 1

Comparison between partition power estimation techniques

| Measurement Technology | Offset from ADC | Method of Measurement | No. of Channels | Sampling Rate | Workload Dependency | Target Power Monitoring Level |
|---|---|---|---|---|---|---|
| Direct ADC Measurement [10] | — | Dedicated Current Sensors | 6 | 4K S/s | Not dependent | Board level |
| Runtime Power Monitoring [18] | 12.5% (Average) | Power Model and Table Look Up | 22 | 1K S/s | Dependent | Architectural components |
| Modeling with Event Counters [8] | 10% (Average) | Power Model and Event Counters | 12 | NA | Dependent | Architectural components |
| Counters with Numerical Analysis | 1.25% (Maximum) | Weighted Counter Values | 350 | 250K S/s** | Not dependent | Board, Architectural, and Sub-circuit |

**Sampling rate is limited due to maximum data bandwidth of the evaluation platform Table 2 compares an example of this approach ("Counters with Numerical Analysis") with examples of other tools that attempt to measure per-partition or per-cluster power.

TABLE 2

Comparison between partition power estimation techniques

| Measurement Technology | Method of Measurement | No. of Channels | Sampling Rate | Overhead |
|---|---|---|---|---|
| Altera PowerPlay | Estimated power through simulation | 4 | 3.125 Gbps | USB, software based simulation |
| Xilinx XPower | Estimated power through simulation | 14 | — | USB, software based simulation |
| Performance-driven Clustering | Estimated Power derived through simulation | — | — | Inaccurate due to manufacturing variations |
| Intel Itanium | Model based power estimation | 120 | 125 kS/s | Counters, Voltage regulators, PLL and frequency controllers. |

TABLE 2-continued

Comparison between partition power estimation techniques

| Measurement Technology | Method of Measurement | No. of Channels | Sampling Rate | Overhead |
| --- | --- | --- | --- | --- |
| Capacitance based Technique | Capacitance based measurements | 2 | 50 MS/s | Xpower, Switched capacitors and resistors |
| AMD On-chip power estimation | Model based power estimation | 95 | — | Counters, Voltage regulators, PLL and frequency controllers. |
| *Counters with Numerical Analysis | Weighted Counter Values | 350 | 250K S/s** | Digital Counters |

--Logic Cones-Based Counter Assignment

In order to implement this technique to achieve maximum accuracy without any changes to gate network structure, counters may be added by identifying logical cones in the Boolean network. Initially, counters may be added to primary inputs of the logic. Subsequently, fan out cones may be identified and additional counters may be added to the output of each cone. This method may be repeated such that all cones are covered without counter duplication. Thus, the problem of addition of counters to achieve given accuracy and granularity may be reduced to optimal cone assignment. An algorithm may be implemented that translates the power estimation problem to instrument counters around atomic sub-circuits obtained by identifying optimally sized cones.

--Distinction

The use of digital counters in this system is fundamentally different from that of event counters. The event counter approach follows a top-down approach to associate power and observed counter values of architectural components by locating a relevant point on a workload specific power curve, whereas the approach described here may utilize a bottom-up approach.

Unlike event counter techniques, the use of digital counters may not require modeling of power. In fact, the use of digital counters may be instrumented to simply measure the signal activity rate of a wire or a group of wires in a system. The counter values may quantify activities that are closely correlated to the actual dynamic power dissipation of the logic blocks. This may effectively sense power using the counters.

The theory and more specific details of this approach are now presented.

The Theory

With the density of logic on chips increasing with every step of technology scaling, it may be harder to simulate components to evaluate power consumption under process variations. Under such conditions, it may become increasingly important to provide digital circuit designers an intuition of sub-circuit behavior which transcends from device model simulation to actual silicon to create effective low power designs.

--Problem Formulation

The approach may begins with the following CMOS circuit dynamic power equation:

$$P = ACV^2F \qquad (1)$$

The equation may be useful in estimating dynamic power at various levels of a system where activity factor (A), total capacitance (C), supply voltage (V), and clock frequency (F) can be extracted. This equation can be used to represent the total power of a given circuit as a sum of power consumed at n different points of the circuit. While this representation can be used to compute dynamic power at the level of sub-circuit, it may not account for the power variations that exist in an actual chip such as hazards, process, and environment variations. Therefore, the equation may be augmented to approximately account for these variations with additional parameters q for each wire and R for the entire circuit (this can be seen as a residual parameter, which represents the sum of all of the unaccounted power such as noise) as shown in equation 2:

$$P = R + \sum_{i=1}^{n} q_i a_i c_i v_i^2 f_i. \qquad (2)$$

--Analysis with Logic Simulation and Global Power Measurements

For a given circuit, an accurate power estimate of internal circuit during its operation can improve various tests and specification tasks. In this section, a method is described of accurately estimating power at the level of wire using a combination of gate level simulation and/or emulation and global power measurement.

Putting all variations aside, voltage ($v_i$) and frequency ($f_i$) at every wire in the circuit may be determined. Given a circuit layout, capacitance ($c_i$) can also be determined at every wire through static analysis. When the circuit is not engaged in dynamic voltage and frequency scaling, these parameters may remain constant. Then, the equation can be simplified by combining all of the parameters into a single constant, $s_i = c_i v_i^2 f_i$, which can be seen as a scaling constant. The effect of dynamic voltage and frequency scaling can be accounted for by considering each stable state independently with different values of scaling constant.

$$P = R + \sum_{i=1}^{n} q_i a_i s_i \qquad (3)$$

The main contributing parameter of dynamic power may be the activity rate at each wire ($a_i$). The activity rate of a wire can be determined by counting its on-off transitions over time and then dividing the count by the maximum signal transitions possible during that time. Therefore, a logic simulator and benchmark vectors may be used to extract the activity rate of the wire over the time of operation.

Due to manufacturing variations, every chip of the same design may differ in the way they consume power. The scale of differences may be dependent on the fabrication process and its operation environment. Equation 3, accounts for the differences that are dependent on process variations, physical layout, and logic activities with Q={$q_1, \ldots, q_n$} and resolve to account for the rest with R. Q may be tightly associated with the functional and physical aspects of the chip, and thus deterministic given accurate values of the parameter. On the other hand, R may represents small residual factors that are difficult to account for, such as noise from ADC or instrumentation. This approach may include derivation of Q from logic equations and accurate total power estimates or measurements of the circuit.

Accurate total power of a chip can be measured using a current sense resistor and analog-to-digital converter (ADC) at a fixed sampling rate. This power measurement may be agnostic to the internals of the circuit, and yet it may accurately account for cumulative effects of the variations in the circuit during the sample period. As a chip processes through a given benchmark, power measurements may vary over time. Along with this variation, activity rates of all wires may vary over time. Then, power measurements and activity rates of the wires may be assigned over the same sampled period to equation 3 to form a unique linear equation of n+1 unknowns.

If the benchmark vectors change the power measurements and the activity rates to different values at every sample, the equations generated from each samples may be relatively independent. Given this assumption, a sliding window over the series of linear equations may be created to perform independent component analysis. Since R may not be a fixed value but, with small magnitude, the optimization analysis may be performed to minimize R for every window using Q derived from the previous window. Once Q converges to a common value, it can be used along with $A=\{a_1, \ldots a_n\}$ and $S=\{s_1, \ldots s_n\}$ to estimate the power consumed at every wire.

Since power may be directly measured by ADC, it may become unnecessary to derive S at every wire through static analysis. Instead, equation 3 may be simplified by representing Q and S with a single weight parameter $W=\{q_1 s_1, \ldots q_n s_n\}$.

$$P = R + \sum_{i=1}^{n} a_i w_i \tag{4}$$

By applying the ICA on the sliding window, W can be derived using the same method described above.

--Approximating Activity Rate of Sub-Circuit

For high complexity systems, accounting for transition count at every wire for every benchmark through logic simulation may require a tremendous amount of processing and time. Performing the same function on hardware may be less feasible due to hardware and power overhead from the counters needed to collect signal transition for every wire.

Therefore, the activity rate of a sub-circuit may be approximated with a fewer number of activity rate sensors. In other words, fewer wires may be intelligently selected within and surrounding a sub-circuit that, when combined together, most accurately and proportionally represent the activity rate of the sub-circuit. Prior work observed that increased input vector activity produced larger total activity for all of the common benchmark circuits. See J. H. Anderson and F. N. Najm, "Power Estimation Techniques for FPGAs," IEEE Transaction on VLSI, v12, pp. 1015-1027, 2004.

An interpretation of this result may be applied to the problem formulation to approximate the total activity of logically dependent set of wires with signal transitions counts from much smaller set of wires. More precisely, the summation of the equation 4 may be partitioned into k summations, each consisting of values from set of wires that are tightly dependent as shown in equation 5.

$$P = R + \sum_{i=1}^{n_1} a_i w_i + \sum_{i=n_1+1}^{n_2} a_i w_i + \ldots + \sum_{i=n_{k-1}+1}^{n} a_i w_i \tag{5}$$

Then the approximation approach may allow each summation may be rewritten with the product of the new weight (w') that is associated with all of the partitioned set of wires and the transition count from the input wire (a') that may proportionally influence the activity rates of the set.

$$P = R + a'_1 w'_1 + a'_2 w'_2 + \ldots + a'_k w'_k \rightarrow P = R + \sum_{i=1}^{k} a'_i w'_i \tag{6}$$

This approximation method may bring back the equation in the same form as equation 4. Therefore, the same ICA based algorithm can be applied to derive the power. The main difference may be that the number of wires that need to be monitored may be reduced. The accuracy of this method may be dependent on how well the wires are partitioned into logically dependent sets and whether fewer monitored wires best represents total activity of each set.

--Logic Cones Based Counter Assignment

The simulation models presented in S. Gupta and F. Najm, "Power modeling for high-level power estimation," IEEE Trans. VLSI systems, vol. 8, no. 1, pp. 18-29, February 2000.; and K. M. Buyukasahin et al., "Early Power Estimation for VLSI Circuits," IEEE Trans. on Computer-aided design of integrated circuits and systems, Vol. 24, pp. 1076-1088, 2005 assume a reliable device model for initial data to predict power. As glitches produce measurable power dissipation, such hazards in circuits may increase the errors in these prediction systems. Furthermore, the physical implementation in silicon may be shown to have variability in delay, threshold, and VDD drops across the chip. See K. Bernstein, D. J. Frank, A. E. Gattiker, W. Haensch, B. L. Ji, S. R. Nassif, E. J. Nowak, D. J. Pearson, and N. J. Rohrer, "High-Performance CMOS Variability in the 65-nm Regime and Beyond," IBM J. Res. & Dev. 50, No. 4/5, 433-449, 2006. The physical effects contributing to such variations may be hard to quantify within a device model, which may make most simulation models inconceivable during silicon implementation. Considering all the above issues, a statistical technique may be used to abstract finer physical details by representing it as a weight for measurement in order to achieve a simpler, accurate, intuitive, and reliable method for simulation and measurement that transcends various stages of design development.

The method described herein may measure activity of wires or group of wires that capture the complete activity of each component of interest to measure total system power. Ideally, to achieve maximum accuracy through this technique, every wire connecting a transistor or a logic gate may be monitored. However, this may be infeasible, even with very few components on-chip. A solution may identify a group of gates such that activity of each wire of the circuit correlates to the input activity. Using this input activity, the power of the system may be measured at various granularities.

--BDD Based Power Measurement

In order to apply this method to any type of ASIC, various methods that have been used in CAD literature may be considered in order to evaluate density of transition at every gate level. A refined technique is proposed to measure power using transition densities within a cone by observing activities at their inputs. This problem may be approached based on estimating power usage by calculating transition density using Binary Decision diagrams (BDD).

Methods have been used in CAD literature to evaluate density of transitions at every gate level. See F. Najm, "Transition density: a new measure of activity in digital circuits." *IEEE Trans. on Computer-Aided Design of Integrated Circuits and Systems*, v12, February 1993. These ideas may be leveraged, along with the technique described above, to derive a refined technique to measure power using transition densities within a cone by observing activities at their inputs.

Reference may also be made to a previous effort that estimated power usage by calculating transition density using Binary Decision diagrams (BDD).

Consider equation (7). Any Boolean function f(Xi) can be represented as two level logic, i.e., a linear combination of OR's and AND's to form a function as:

$$f(X_1 \ldots X_n) = \sum_{N,M}^{n} X_N \cdot X_M, \forall (X_N, X_M) \in (X_1 \ldots X_n). \quad (7)$$

Function $f(X_1 \ldots X_n)$ can be represented by a BDD with $2^N$ nodes, where N α variable ordering. See Wikipedia, Binary Decision Diagrams, http://en.wikipedia.org/wiki/Binary_decision_diagrams.

It can be inferred that, $$\beta(Z_k) \propto \beta(X_i) \quad (8),$$

where $Z_k$ are the wires connected to each gate within the logic and $X_i$ is the activity within the logic.

Since $f(X_i)=F(g(X), h(X), \ldots )$, by monitoring inputs of the logic cones and applying the method described above, the power of each gate can be measured by evaluating BDDs within a cone. The evaluation of BDDs yields transition densities at each gate of the cone, and these transition densities can be included in a different level of ICA to partition the weights per gate. With the knowledge of these weights, for any signal transition at the input, the amount of power drawn at every gate of the logic cone can be accurately measured. This method can be further refined by partitioning the BDDs, see R. E. Bryant. "Graph-Based Algorithms for Boolean Function Manipulation". *IEEE Transactions on Computers*, C-35(8):677-691, 1986, and obtaining weights for each cone within the partition to convert the described problem into counters per partition problem to achieve the given accuracy.

Since the amount of change at the inputs of the logic cones can be extracted, the amount of changes at each gate within the logic cone can be evaluated. Representing these changes as transition densities and applying this method, the power at each gate and wire can be estimated. The evaluation of BDDs yields transition density estimate at each gate of the cone and these estimates can be included in a different level of ICA to partition the weights per gate. With the knowledge of these weights, for any signal transition at the input, the amount of power drawn at every gate of the logic cone can be estimated. This method can be further refined by partitioning the BDDs and obtaining weights for each cone within the partition to convert the described problem into counters per partition problem to measure power for a given accuracy.

Once the activity rates for each wire is derived from smaller set of measured activity values for equation 6, equation 4 may be used to derive estimated weights for every wire. Then the weight can be used to computer power dissipated at every wire.

--Residual Power

In order to transcend from simulation to emulation, this method may be implemented on an FPGA platform. In a practical setting, there may be errors introduced into measurements. The errors might be due to ADC noise, environment noise, and/or noise due to switching of components itself. Under these conditions, the method may be refined by adding a residual component to the measured power as, $$P = \frac{1}{T} * \sum_{x=1}^{N} \sum_{i}^{n} \int_{0}^{T} \beta(i) \cdot V(t) \cdot C(t) \cdot f \, dt + R. \quad (9)$$

This residue may then be measured as:

$$\text{Residue}, R = \sqrt{|(P_{\text{measured}} - P_{\text{calc}})^2|} \quad (10).$$

This algorithm may yield power weights at every iteration; per-component power (Pcalc) may be calculated by multiplying the weights with measured signal activity rates. This result may further be compared with the measured power, $P_{measured}$ to obtain the residual value described in equation 5. During the subsequent iterations performed, the weights may be changed to minimize this residue. The initial weights taken may be used to determine the first step of Pcalc. In the next step, the weights of components may be increased marginally and the residue may be re-evaluated. All the weights may be refined such that the residue no more decreases. Once these weights converge to a fixed value, they may be used for all subsequent power measurements.

Algorithm and Prototype

Experiments were conducted on integrated circuits to measure on-die temperature without using thermal sensors or ADCs; even on an FPGA. See M. Curtis-Maury, A. Shah, F. Blagojevic, D. S. Nikolopoulos, B. R. de Supinski, M. Schulz: "Prediction Models for Multi-dimensional Power-Performance Optimization on Many Cores." *Proceedings of PACT08*, Toronto, Canada, Oct. 25-29, 2008. Similarly, the method described herein of measuring power may be built based on the concept of quantifying the signal activity rate of circuits with strategically placed digital counters and correlating the result against the externally measured power.

--Total System Power

The technique described herein may derive the power dissipation rate of each component using numerical analysis over the signal transition counts at the input and output pins of every sub-component of interest. By performing independent component analysis (ICA) over these signal transitions over moving windows of time and then averaging the results, weights that translate the digital counts to accurate power can be derived.

The technique may be based on the fundamental relation of dynamic power consumption and the activity of a system, which can be expressed into a simpler form. See J. Rabaey, A. Chandrakasan, B. Nikolic—"Digital Integrated circuits: a design perspective," *Pearson Education* (2003), 0130909963:

$$P = \sum_{i=1}^{n} \beta_i p_i, \qquad (11)$$

where $\beta_i$ is the activity factor of each component and $p_i = C_{loadi} V^2 f p_i = CV^2 f$ is the power dissipation rate of the $i^{th}$ component. The static power across the system may be considered to be primarily of sub-threshold leakage current.

For the initial work, static power minimization techniques may not be employed and hence the algorithm may assume that sub-threshold leakage current on a target digital circuit is relatively constant. See M. Pedram and J. Rabaey, "Power Aware Design Methodologies," *Kluwer Academic Publishers*, 2002. Then, the total power of our system may be represented as:

$$P_{Total} = \sum_{i=1}^{n} \beta_i p_i + \sum_{i=1}^{n} P_{leak,i}. \qquad (12)$$

--Deriving Power Weights

The signal activity rates from each component may be collected and sorted to obtain the W matrix. Along with the dynamic components, an additional column with a constant co-efficient may be included in the matrix to consider static power in the measurements. In order to use the W matrix in ICA, the W matrix may be transposed to generate the mixing matrix. The per-component power matrix may be obtained by multiplying inverse of mixing matrix (also known as the un-mixing matrix) with observed dynamic power matrix.

Since run-time measurement of activity rates may include noise, an algorithm may be applied that refines the result through regression and ICA. In this technique, a sliding window may be used to select the range of data from the observed counter and power values to be used by the solver. The key observation from such a solver is that it may quickly find the most suitable result while suppressing all noise through regression.

Using the above algorithm, dynamic power for all components and the total static power may be derived by multiplying the observed power matrix with $W^{-1}$. The weights may be calculated using an initial set of data. Run-time power measurements may be obtained by multiplying the derived weights with the normalized signal activity rates.

--Minimizing Uncorrelated Power

The effect of noise from the ADC on this method may be studied through analysis of the residue as follows:

$$\text{Residue}, R = \sqrt{|(P_{measured} - P_{calc})^2|} \qquad (13).$$

The algorithm may yield power weights at every iteration; and per-component power ($P_{calc}$) may be calculated by multiplying the weights with measured signal activity rates. This result may be further compared with the measured power, $P_{measured}$ to obtain residual value described in equation 13.

Figure 2:
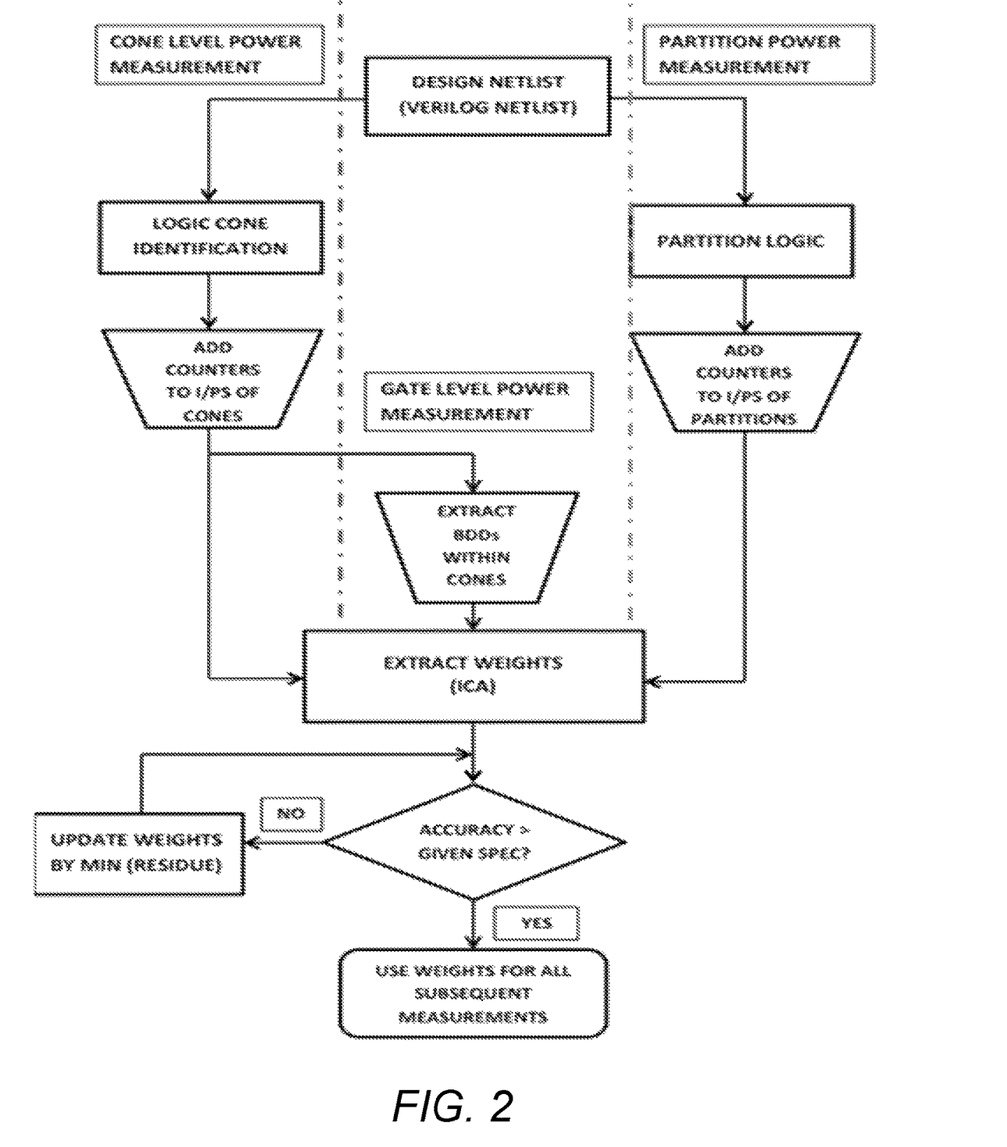
FIG. 2 illustrates an example of a flowchart describing an overall integration of the algorithm that derives the weights for each of the counter measurements.

FIG. 2 illustrates an example of a flowchart describing an overall integration of the algorithm that derives the weights for each of the counter measurements.

--Hardware Instrumentation

Based on this theory, accurate power may be derived if it is possible to instrument every transistor to keep track of its signal activity. In practice, however, such instrumentation may be impractical. Therefore, the hardware may be designed to abstract signal activities of sub-circuits with relatively small number of sensors around and within a circuit.

For the hardware instrumentation, an assumption may be made that the total activity rate of each functional unit is highly correlated to the signal activity rate of input and/or output signals of the unit. Therefore, the hardware architecture may consist of digital counters instrumented at all of available I/O pins around target circuits to simply "count" the number of zero-to-one (or one-to-zero) signal transitions. In addition to the digital counters, the architecture may have a data path that samples and forwards the count values from each counter to a location where the numbers can be analyzed and converted to power measurements.

We also consider accounting for components with simple on/off behavior in a given system. Unlike digital logic, such components may draw a fixed amount of power during their on-time; hence the sensors connected to components must represent the power consumption with the length of time that the component is turned on. Accordingly, the "count" value of the counter effectively represents the power unit dissipated between the samples.

Figure 3A:
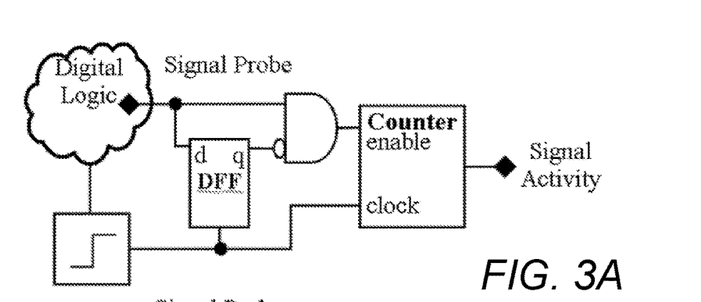
FIGS. 3A and 3B each illustrate an example of a signal transition sensor hardware circuits.
Figure 3B:
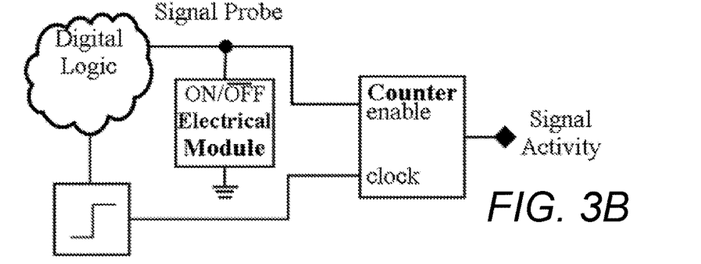

FIGS. 3A and 3B each illustrate an example of a signal transition sensor hardware circuits. FIG. 3A illustrates a counter that is configured to count the logical 1 to 0 transitions of a signal, while FIG. 3B illustrates a counter that times the duration of a circuit placed in an active "ON" state by counting while it is in the "ON" state and by halting the counting when it is the "OFF" state.

Experiments

Counters were added around and within internal components of a NetFPGA Internet Protocol (IP) router design, as well as all of the I/O pins around the FPGA, to determine the signal activity of all of the on-board components connected to the FPGA. The counter was incremented whenever there was a falling transition at the digital output pin of a module of interest. A sum of all the counter values associated with a particular module was considered to build the W matrix.

A resistor was added at the general purpose I/Os (GPIO) of the FPGA to emulate a component with on-off behavior. Within the FPGA, activities of these pins were deterministically controlled during the experiments. Since the value of the resistor was known apriori and the length of time the GPIO was on, the power dissipated by this component could be calculated. Later, this was used to compare the power calculated by this emulated component algorithmically versus the ground truth.

Figure 4:
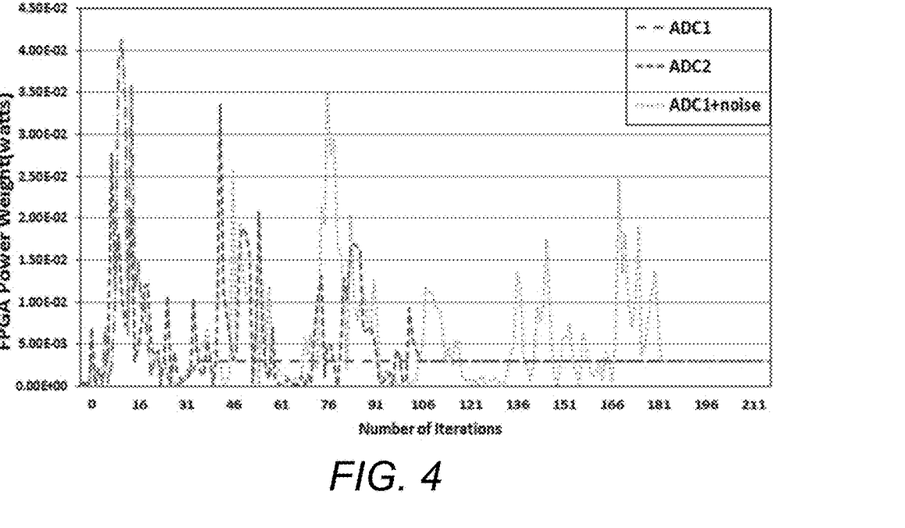
FIG. 4 illustrates the value of subsequent power weight during the run-time calibration for the same monitoring point.

FIG. 4 illustrates the value of subsequent power weight during the run-time calibration for the same monitoring point.

In NetFPGA, there may be no dedicated ADCs that measure power consumed by the platform or its components. Furthermore, the FPGA may not have any way to separate the power consumed by different parts of the internal design. Therefore, the process may begin by comparing the total platform power measured by an ADC against sum of all of the per-component power that is derived using the method described herein.

Using the counter values, the W matrix for ICA may be built. A subset of the experimental data (training set) may be used with ICA to obtain the weights for individual components. While the counters monitoring the pins connected to external on-board components were used to extract total power of the respective components, the counters connected to each sub-circuit were used to extract sub-component power within the FPGA.

The first level ICA was used to extract the FPGA power itself then the second level ICA was used to measure subcomponent power.

Figure 5:
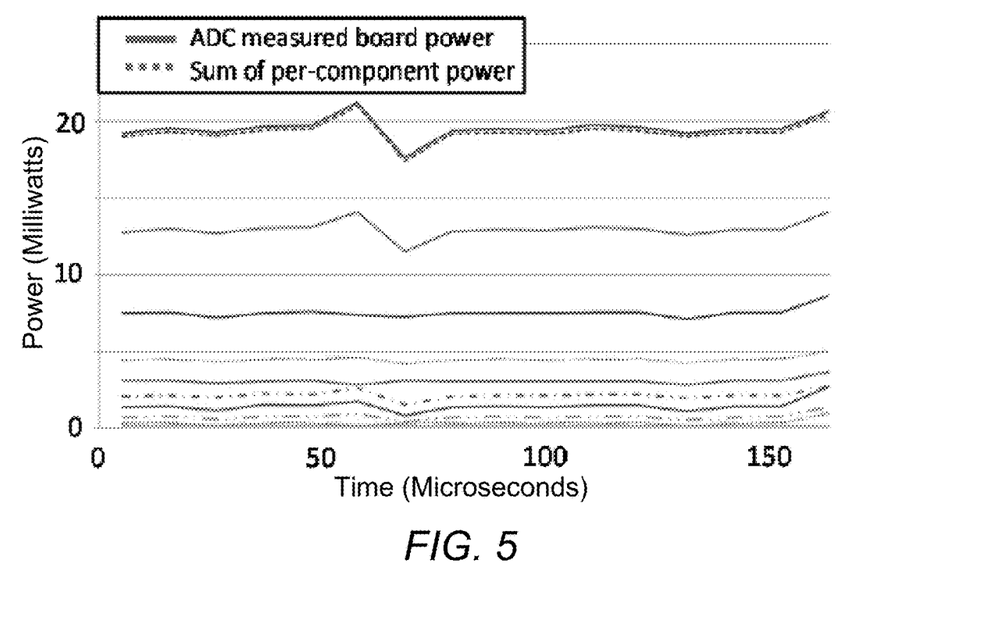
FIG. 5 compares the sum of per-component results with the total power measured with an external ADC.

FIG. 5 compares the sum of per-component results with the total power measured with an external ADC. FIG. 5 shows a time series of calculated power measurements for the active components on the board. In addition to the per component power, their sum is overlaid on top of the power measured by an external ADC.

Table 3 presents a comparison between the results obtained using the approach described herein verses using two ADCs:

TABLE 3

| Target Component(s) | Max. Error | Min. Error | Avg. Error |
| --- | --- | --- | --- |
| Combined - ADC1 | 2.87% | 1.8% | 2.3% |
| Resistor - ADC1 | 1.9% | 0.9% | 1.4% |
| Resistor - ADC2 | 4% | 2.2% | 3.1% |

Table 3 presents the summary of the comparison to indicate the closeness of the result using approach disclosed herein against the ADC based method. Measurements using the approach used herein were collected at 128 Ks/sec/channel, whereas ADCs are measuring below 20 Ks/sec.

--Power Partitioning

The measured power of the resistor (an example of an on/off component) added to the NetFPGA was compared with the derived power values of the technique described herein to show that the algorithm described herein does indeed partition the total power at sub-circuit granularity. The results shown in Table 3 illustrate that the method described herein partitions the power accurately at a sub-circuit level.

--Sources of Noise and Error

In order to test the resilience of the algorithm described herein, an additional experiment was performed with a noisy ADC. An artificially generated signal was also mixed into one of the ADC measurements and applied the algorithm described herein to derive corresponding power weights. FIG. 4 illustrates that the power weights for the FPGA converged to the same value for all three cases. Furthermore, the results showed that the algorithm deposited uncorrelated factors of the signal into the residue component of the equation; ultimately yielding the same per component power weights even with noisy or less accurate ADCs.

Figure 6:
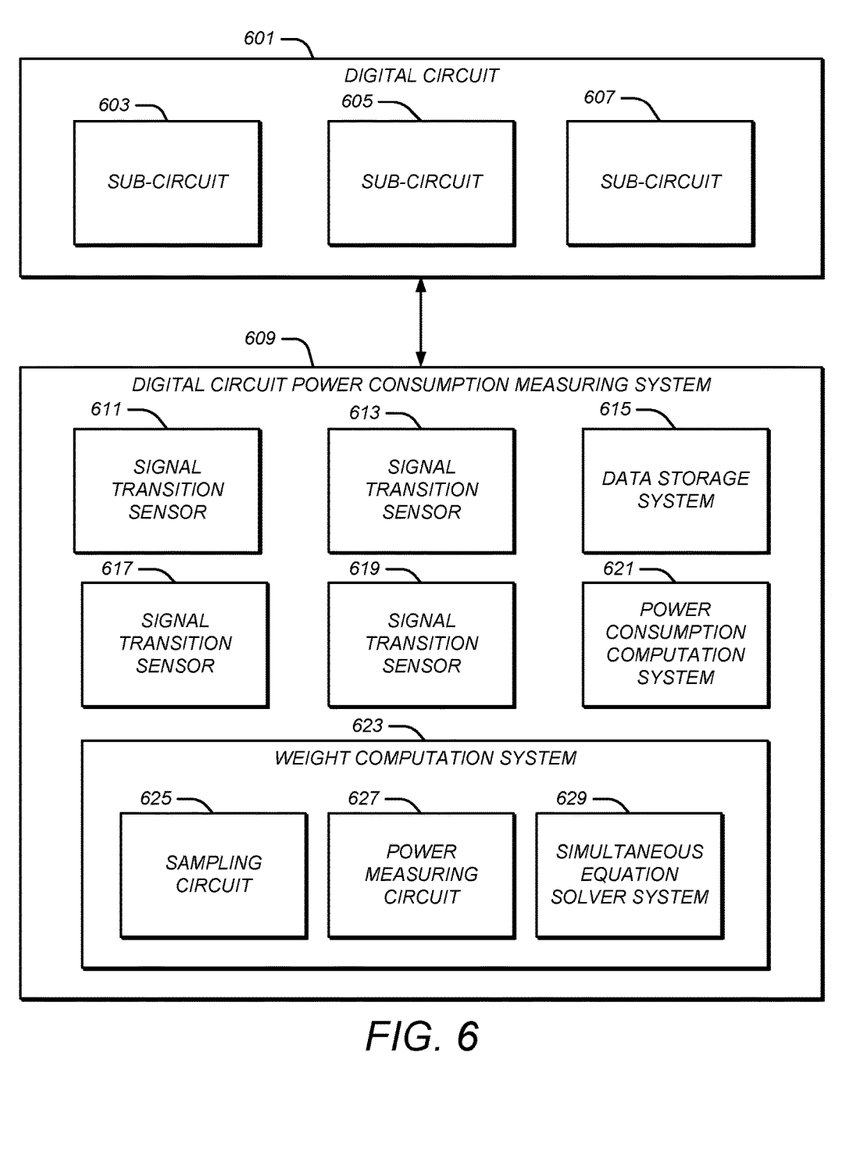
FIG. 6 illustrates an example of a digital circuit connected to an example of a system for measuring power consumed by the digital circuit.

FIG. 6 illustrates an example of a digital circuit connected to an example of a system for measuring power consumed by the digital circuit.

As illustrated in FIG. 6, a digital circuit 601 may include multiple sub-circuits, such as sub-circuits 603, 605, and 607. Each sub-circuit may include more than one transistor and may have one or more inputs (not shown). Each sub-circuit may not contain any energy-consuming component that is in another of the sub-circuits. All of the sub-circuits may include all of the energy-consuming components that are in the digital circuit 601.

As also illustrated in FIG. 6, a digital circuit power consumption measuring system 609 may be connected to the digital circuit 601 and may include multiple signal transition sensors, such as signal transition sensors 611, 613, 617, and 619. The digital circuit power consumption measuring system 609 may also include a data storage system 615, a power consumption computation system 621, and a weight computation system 623.

Each signal transition sensor may be connected to an input to one of the sub-circuits and configured to count the number of signal transitions at the input or to time the duration of a signal transition at the input. For each sub-circuit, there may be at least one signal transition sensor connected to one of its inputs. For example, the signal transition sensor 611 may be connected to an input to the sub-circuit 603 and the signal transition sensor 613 may be connected to an input to the sub-circuit 605.

There may be multiple signal transition sensors, each connected to a different input of the same sub-circuit. For example, the signal transition sensor 617 may be connected to one input to the sub-circuit 607, and the signal transition sensor 619 may be connected to a different input to the sub-circuit 607.

The signal transition sensors may be of the types illustrated in FIG. 3A or 3B or of another type.

For each sub-circuit, the input to which a signal transition sensor is connected, or the inputs to which different signal transition sensors are connected collectively, may control all changes in the power consumption of all components within that sub-circuit.

The data storage system 615 may be configured to store weight information indicative of an amount of power that is being consumed by each sub-circuit based on a count that is counted by or a time duration that is timed by each signal transition sensor that is connected to an input of that sub-circuit.

The power consumption computation system 621 may be configured to compute the amount of power being consumed by the digital circuit based on a count that is counted by or a time duration that is timed by each signal transition sensor and the weight information. It may be configured to do so by summing the power that is consumed by each sub-circuit, as determined based on each count that is counted by or each time duration that is timed by each signal transition sensor that is connected to an input of that sub-circuit and the weight information for that sub-circuit. The power consumption computation circuit 621 may be configured to determine the power consumed by at least one sub-section of at least one sub-circuit that is not monitored by a signal transition sensor using a binary decision diagram.

The weight computation system 623 may be configured to determine the weight information. The weight computation system 623 may include a sampling circuit 625, a power measuring circuit 627, and a simultaneous equation solver system 629.

The power measuring circuit 627 may be configured to measure the total power being consumed by the digital circuit. For example, the power measuring circuit 627 may include a low resistance in series with the power line to the digital circuit and a DAC to measure the voltage across it. Based on the known voltage of the power line and the measured voltage across the low resistance, the power measuring circuit 627 may be configured to compute the power to the digital circuit.

The sampling circuit 625 may be configured to sample and store operational information that is indicative of the following for each of a set of different power-consumption conditions under which the digital circuit 601 is operated: (a) the power consumed by the digital circuit 601 during the power-consumption condition, as measured by the power measuring circuit 627; and (b) the count of the number of signal transitions that is counted by or the time duration of a signal transition that is timed by each of the signal transition sensors during the operational condition.

The simultaneous equation solver system 629 may be configured to solve a set of simultaneous equations, one for each power-consumption condition, to determine the weight information. Each equation may relate the power consumed by the digital circuit during the power-consumption condition to which the equation is associated, to the sum of the power consumed by each sub-circuit during the operational condition, as determined based on the count of the number of signal transitions that is counted by or the time duration of a signal transition that is timed by each of the signal transition sensors that are connected to an input of that sub-circuit during the operational condition, and the weigh information concerning that sub-circuit that is to be determined. Any of the computational approaches discussed above may be implemented.

The weight computation system 623 may be configured to compensate for power that is consumed due to circumstances other than signal transitions on the inputs to which a signal transition sensor is connected. Any of the approaches that are discussed above in connection with such a residual determination may be used, as well as other approaches. For example, the weight compensation system may be configured to compensate by performing a statistical fitting of the total power measured by the power measuring circuit to the sum of the power consumed by each sub-circuit, as determined based on the count of the number of signal transitions that is counted by or the time duration of a signal transition that is timed by each of the signal transition sensors that are connected to an input of that sub-circuit, and the weigh information concerning that sub-circuit that is to be determined.

The digital circuit 601 and the digital circuit power consumption measuring system 609 may be on the same single chip. The digital circuit 601 may instead be on multiple chips on a single board, and the digital circuit power consumption measuring system 609 may be in circuitry on the same board. The digital circuit power consumption measuring system 609 may utilize components in the digital circuit 601, such as a processor for determining the weights.

The digital circuit 601 may be on a chip and the digital circuit power consumption measuring system 609 may be configured to dynamically manage the power that is consumed by the chip in accordance with established techniques.

The digital circuit power consumption measuring system 609 may be configured to predict future power needs of the digital circuit 601 and, based thereon, dynamically manage the power that is consumed by the chip, again in accordance with established techniques.

The digital circuit 601 may be on a mobile computing platform, such as a smart phone or tablet, and the digital circuit power consumption measuring system 609 may be configured to dynamically manage the power that is consumed by the mobile computing platform, again in accordance with established techniques.

The digital circuit power consumption measuring system 609 may be configured to identify stressed sub-circuits within the digital circuit, again in accordance with established techniques. the digital circuit power consumption measuring system 609 may be configured to identify the location and timing of ground bounce, again in accordance with established techniques.

The digital circuit power consumption measuring system 609 may be configured to generate a power specification for the digital circuit, again in accordance with established techniques.

The digital circuit power consumption measuring system 609 may be configured to perform a method for determining weight information for each sub-circuit that contains multiple transistors in a digital circuit that is indicative of an amount of power that is being consumed by the sub-circuit based on a count of a number of signal transitions or a time duration of a signal transition at at least one input to the sub-circuit that is monitored by a signal transition sensor. The method may include during each of a set of different power-consumption conditions under which the digital circuit is operated, sampling and storing in a data storage system: the total power being consumed by the digital circuit, as measured by a power measuring circuit; the count of the signal transition or the time duration of a signal transition at each monitored input to each sub-circuit, as determined by one of the signal transition sensors; and solving a set of simultaneous equations, one for each power-consumption condition, to determine the weight information, each equation relating the power consumed by the digital circuit during the power-consumption condition to which the equation is associated, to the sum of the power consumed by each sub-circuit during the operational condition, as determined based on the count of the number of signal transitions that is counted by or the time duration of a signal transition that is timed by each of the signal transition sensors that are connected to an input of that sub-circuit during the operational condition, and the weigh information concerning that sub-circuit that is to be determined.

Advantages

Unlike other methods, the techniques described herein may eliminate the use of mixed signal components as well as other complicated power modeling techniques. Advantages of the techniques described herein may include:
  Immediate results: With these methods, power dissipated by various components may be measured at every clock edge. The previously described works may have an issue of latency either due to software or delays in reading digital values from the ADC or both, thus making it infeasible for high speed measurements at finer granularities. Due to such latency, there may be errors introduced in the curve fit, thereby introducing errors in all subsequent measurements.
  Low overhead: Sparsely distributed digital counters at the periphery of an integrated circuit may dissipate a relatively small amount of power as compared to the entire chip. Furthermore, power dissipated by counters in the measurement logic can be accurately identified and compensated while deriving the component specific rates. Whereas in previous methods, it may be hard to isolate power due to measurement itself.
  Scalability: The methods described herein may be used with systems comprised of a few tens of components (such as PCBs) to thousands of components (such as a SoC) without loss in accuracy of measurement.
  Fine grained power aware system designs: The techniques described herein may be used to measure power of each logic partition accurately. Leveraging these techniques in power management units may provide a greater capability to accurately measure and control power dissipated in various logical partitions across the chip rather than physical components. This may imply that parts of a certain component which does not consume significant amount of power can be left running continuously, while the part which consumes more power is switched off based on its effect on every other component across the chip.

Accurate power prediction: This techniques can be further extended to measure power of each gate. Using such a tool, power drawn at every gate can be accurately predicted for the subsequent instances of time. This can potentially be used to control VDD ringing and ground bounce that hinders system performance.

Conclusions

Methods have been presented that may measure per-component power accurately and efficiently using digital counter and numerical analysis. By comparing values of actual power measured and values obtained from these methods, it can be concluded that the methods may be consistent and accurate. These methods may also suppress the effect of noise, as the same weights are obtained for cases of using a noisy and low-noise ADC.

An example of these methods was implemented on a FPGA with a resistor on one of the pins and results on sub-circuit power measurements were reported. The technology resulted in a maximum measurement difference of 2% against reference ADC, while collecting power information from 350 different wires on the design at 250 KS/sec per wire. By comparing the measurement using this approach against an ADC based power measurement over a resistor in the design, this technique was indeed accurate and scalable at various granularities. Hence, by observing signal activity rates along with ICA, power consumed by ICs and sub-components can be reliably measured without any intricate mixed signal probing or curve fitting techniques.

Except as otherwise indicated, each of the various algorithms that have been discussed herein, as well as the digital circuit power consumption measuring system, are implemented with a computer data processing system that is configured to perform the functions that have been described herein for each algorithm and system. Each computer data processing system includes one or more processors, tangible memories (e.g., random access memories (RAMs), read-only memories (ROMs), and/or programmable read only memories (PROMS)).

The computer data processing system may utilize parts of the digital circuit whose power consumption is being monitored or be completely separate from it. When the monitored digital circuit is on a single chip, the computer data processing system may also be on that chip or separate from it.

The computer data processing system may include software (e.g., one or more operating systems, device drivers, application programs, and/or communication programs). When software is included, the software includes programming instructions and may include associated data and libraries. When included, the programming instructions are configured to implement one or more of the algorithms that have been described herein. The software may be stored on or in one or more non-transitory, tangible storage devices, such as one or more RAMS, ROMS, and/or flash memories. The software may be in object code format. The software may be loaded into a non-transitory memory and executed by one or more processors.

Associated data, such as the weights that are determined, may be stored in any type of volatile and/or non-volatile tangible data storage memory, such as one or more RAMS, ROMS, and/or flash memories.

The components, steps, features, objects, benefits, and advantages that have been discussed are merely illustrative. None of them, nor the discussions relating to them, are intended to limit the scope of protection in any way. Numerous other embodiments are also contemplated. These include embodiments that have fewer, additional, and/or different components, steps, features, objects, benefits, and advantages. These also include embodiments in which the components and/or steps are arranged and/or ordered differently.

For example, the algorithm and the sensors can be used in conjunction with tools such as logic, as well as transistor level simulators and emulation platforms, to enable pre-fabrication power estimates and accelerated post-fabrication power estimation and verification.

Not all components mentioned above are necessary to enable power measurements. For example, only coarsely calibrated scaled counters may be needed to sufficiently estimate the power for a given circuit. Another option may be to have an external calibrator, and algorithms may be used to individually calibrate the power measurements and store the weights into non-volatile memory at some frequency. Neither of these utilities may need an ADC on-board or on-chip to dynamically calibrate the monitoring system, nor will they need application specific and/or general purpose processors to derive weights for the transition counts.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

All articles, patents, patent applications, and other publications that have been cited in this disclosure are incorporated herein by reference.

The phrase "means for" when used in a claim is intended to and should be interpreted to embrace the corresponding structures and materials that have been described and their equivalents. Similarly, the phrase "step for" when used in a claim is intended to and should be interpreted to embrace the corresponding acts that have been described and their equivalents. The absence of these phrases from a claim means that the claim is not intended to and should not be interpreted to be limited to these corresponding structures, materials, or acts, or to their equivalents.

The scope of protection is limited solely by the claims that now follow. That scope is intended and should be interpreted to be as broad as is consistent with the ordinary meaning of the language that is used in the claims when interpreted in light of this specification and the prosecution history that follows, except where specific meanings have been set forth, and to encompass all structural and functional equivalents.

Relational terms such as "first" and "second" and the like may be used solely to distinguish one entity or action from another, without necessarily requiring or implying any actual relationship or order between them. The terms "comprises," "comprising," and any other variation thereof when used in connection with a list of elements in the specification or claims are intended to indicate that the list is not exclusive and that other elements may be included. Similarly, an element preceded by an "a" or an "an" does not, without further constraints, preclude the existence of additional elements of the identical type.

None of the claims are intended to embrace subject matter that fails to satisfy the requirement of Sections 101, 102, or 103 of the Patent Act, nor should they be interpreted in such a way. Any unintended coverage of such subject matter is hereby disclaimed. Except as just stated in this paragraph, nothing that has been stated or illustrated is intended or should be interpreted to cause a dedication of any component, step, feature, object, benefit, advantage, or equivalent to the public, regardless of whether it is or is not recited in the claims.

The abstract is provided to help the reader quickly ascertain the nature of the technical disclosure. It is submitted with the understanding that it will not be used to interpret or limit the scope or meaning of the claims. In addition, various features in the foregoing detailed description are grouped together in various embodiments to streamline the disclosure. This method of disclosure should not be interpreted as requiring claimed embodiments to require more features than are expressly recited in each claim. Rather, as the following claims reflect, inventive subject matter lies in less than all features of a single disclosed embodiment. Thus, the following claims are hereby incorporated into the detailed description, with each claim standing on its own as separately claimed subject matter.

The invention claimed is:

1. A system for measuring sub-circuit level dynamic power static power, and uncorrelated residual power dissipated in an actual chip that contains multiple sub-circuits, each sub-circuit made of group of gates with one or more inputs, the system comprising:
    signal transition sensors connected to only to inputs of each sub-circuit and configured to count the number of signal transitions at each input or to time the duration of a signal transition at each input;
    a data storage system configured to store weight information indicative of an amount of dynamic power that is being consumed by each sub-circuit based on a count that is counted by or a time duration that is timed by each signal transition sensor that is connected to the inputs of that sub-circuit;
    a data storage system configured to store static power information indicative of the total static power that is being consumed by the digital circuit;
    a power consumption computation system configured to clean the measured power by extracting residual factors, including uncorrelated power consumption of a digital circuit and measurement noise from a measured power;
    a power consumption computation system configured to:
        determine sub-circuit level dynamic power and a total static power of the actual chip with manufacturing variations by partitioning a cleaned measured power using the count that are counted by or the time duration that are timed by only the signal transition sensors and the weight information; and
        account for small differences in dynamic power weights and static power of the digital circuit during its operation by using sliding windows.

2. The system of claim 1 wherein the power consumption computation system is configured to compute the amount of power being consumed by the digital circuit by summing the dynamic power that is consumed by each sub-circuit, as determined based on each count that is counted by or each time duration that is timed by each signal transition sensor that is connected to an input of that sub-circuit and the weight information for that sub-circuit and the total static power of the digital circuit, as determined based on constant co-efficient.

3. The system of claim 1 wherein:
    each signal transition sensor is configured to count the number of signal transitions at the input to the sub-circuit to which the signal transition sensor is connected;
    the data storage system is configured to store weight information indicative of an amount of dynamic power that is being consumed by each sub-circuit based on a count that is counted by each signal transition sensor that is connected to an input of that sub-circuit; and
    the power consumption computation system is configured to compute the amount of dynamic power being consumed by the digital circuit based on a count that is counted by each signal transition sensor and the weight information.

4. The system of claim 1 wherein:
    each signal transition sensor is configured to time the duration of a signal transition at the input to the sub-circuit to which the signal transition sensor is connected;
    the data storage system is configured to store weight information indicative of an amount of dynamic power that is being consumed by each sub-circuit based on a time duration that is timed by each signal transition sensor that is connected to an input of that sub-circuit; and
    the dynamic power consumption computation system is configured to compute the amount of power being consumed by the digital circuit based on a time duration that is timed by each signal transition sensor and the weight information.

5. The system of claim 1 wherein the data storage system is configured to store static power information indicative of an amount of total static power that is being consumed by the entire digital circuit based on a constant amount of leakage power component present in all of the measured power within a sliding window.

6. The system of claim 5 wherein the data storage system is configured to store residual information indicative of a noise and an uncorrelated component of the total measured power derived through on regression and independent component analysis (ICA) based simultaneous equation solver applied on a sliding window.

7. The system of claim 1 wherein all of the sub-circuits include all of the energy-consuming components that are in the digital circuit.

8. The system of claim 1 wherein at one of the sub-circuits includes at least two inputs and wherein there is a different signal transition sensor connected to at least two of the inputs of the at least one sub-circuit.

9. The system of claim 1 wherein, for each sub-circuit, the input to which a signal transition sensor is connected, or the inputs to which different signal transition sensors are connected collectively, control all changes in the dynamic power consumption of all components within that sub-circuit.

10. The system of claim 1 further comprising a weight computation system configured to determine the weight information.

11. The system of claim 10 wherein the weight computation system includes signal transition sensors and weight extraction circuit configured to partition the total power being consumed by the digital circuit.

12. The system of claim 11 wherein the weight computation system includes a sampling circuit that is configured to sample and store operational information that is indicative of the following for each of a set of different power-consumption conditions under which the digital circuit is operated:
the power consumed by the digital circuit during the power-consumption condition, as measured by the power measuring circuit; and the count of the number of signal transitions that is counted by or the time duration of a signal transition that is timed by each of the signal transition sensors during the operational condition.

13. The system of claim 12 wherein the weight computation system includes an simultaneous equation solver system configured to solve a set of simultaneous equations, one for each power-consumption condition, to determine the dynamic and the static weight information and the residual.

14. The system of claim 13 wherein each equation relates the power consumed by the digital circuit during the power-consumption condition to which the equation is associated, to the sum of the dynamic power consumed by each sub-circuit and the total static power consumed by the entire digital circuit during the operational condition, as determined based on the count of the number of signal transitions that is counted by or the time duration of a signal transition that is timed by each of the signal transition sensors that are connected to an input of that sub-circuit during the operational condition, and the weigh information concerning that sub-circuit, the total static power information concerning the entire digital circuit, and the residual information that is to be determined.

15. The system of claim 14 wherein the weight computation system is configured to compensate for power that is consumed due to circumstances other than signal transitions on the inputs to which a signal transition sensor is connected.

16. The system of claim 15 wherein the weight compensation system is configured to compensate the dynamic power consumed by sub-circuit by performing a statistical fitting of the total power measured by the power measuring circuit to the sum of the power consumed by each sub-circuit, as determined based on the number of signal transitions that is counted by or the time duration of a signal transition that is timed by each of the signal transition sensors that are connected to an input of that sub-circuit, and the weight information concerning that sub-circuit that is to be determined.

17. The system of claim 1 wherein the dynamic power consumption circuit is configured to determine the power consumed by at least one sub-section of at least one sub-circuit that is not monitored by a signal transition sensor using a binary decision diagram.

18. The system of claim 1 wherein the system and the digital circuit are both on a single chip.

19. The system of claim 1 wherein the digital circuit is on a chip and the system is configured to dynamically manage the power that is consumed by the chip.

20. The system of claim 19 wherein the system is configured to predict future power needs of the digital circuit and, based thereon to dynamically manage the power that is consumed by the chip.

21. The system of claim 1 wherein the digital circuit is on a mobile computing platform and the system is configured to dynamically manage the power that is consumed by the mobile computing platform.

22. The system of claim 1 wherein the system is configured to identify stressed sub-circuits within the digital circuit.

23. The system of claim 1 wherein the system is configured to identify the location and timing of ground bounce.

24. The system of claim 1 wherein the system is configured to generate a power specification for the digital circuit.

25. The system of claim 1 wherein each sub-circuit is a logical cone.

* * * * *